United States Patent [19]
Davis et al.

[11] Patent Number: 5,892,264
[45] Date of Patent: Apr. 6, 1999

[54] HIGH FREQUENCY ANALOG TRANSISTORS, METHOD OF FABRICATION AND CIRCUIT IMPLEMENTATION

[75] Inventors: Christopher K. Davis, Merrin Island; George Bajor; James D. Beasom, both of Melbourne; Thomas L. Crandell, Palm Bay; Taewon Jung, Palm Bay; Anthony L. Rivoli, Palm Bay, all of Fla.

[73] Assignee: Harris Corporation, Melbourne, Fla.

[21] Appl. No.: 786,569

[22] Filed: Jan. 21, 1997

Related U.S. Application Data

[62] Division of Ser. No. 131,369, Oct. 4, 1993, Pat. No. 5,668,397.

[51] Int. Cl.⁶ ................................... H01L 29/00
[52] U.S. Cl. ................. 257/511; 257/520; 257/525; 257/517
[58] Field of Search .................. 257/511, 525, 257/520, 81, 99, 607, 517

[56] References Cited

U.S. PATENT DOCUMENTS

| | | |
|---|---|---|
| 4,471,283 | 9/1984 | Presley . |
| 5,072,287 | 12/1991 | Nakagawa et al. ............ 257/525 |
| 5,134,403 | 7/1992 | Rush . |
| 5,175,607 | 12/1992 | Ikeda ........................ 257/511 |
| 5,481,129 | 1/1996 | DeJong et al. . |
| 5,606,320 | 2/1997 | Kleks . |
| 5,668,397 | 9/1997 | Davis et al. ................. 257/520 |

*Primary Examiner*—Mahshid D. Saadat
*Assistant Examiner*—S. V. Clark
*Attorney, Agent, or Firm*—Rogers & Killeen

[57] ABSTRACT

A fabrication process for dielectrically isolated high frequency complementary analog bipolar and CMOS transistors. Polysilicon extrinsic bases, polysilicon emitters with sidewall spacers formed after intrinsic base formation provides high current gain, large emitter-to-base breakdown voltage, large Early voltage, and high cutoff frequency.

14 Claims, 8 Drawing Sheets

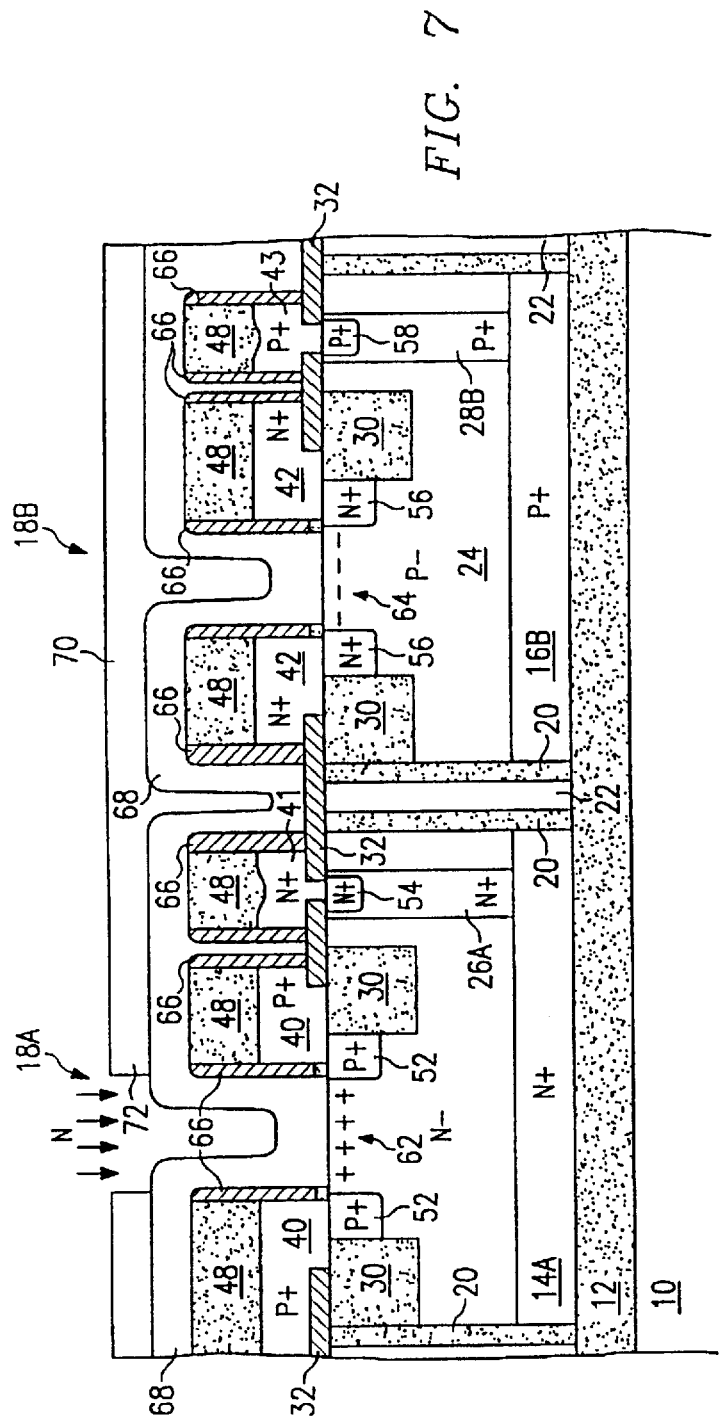
FIG. 7
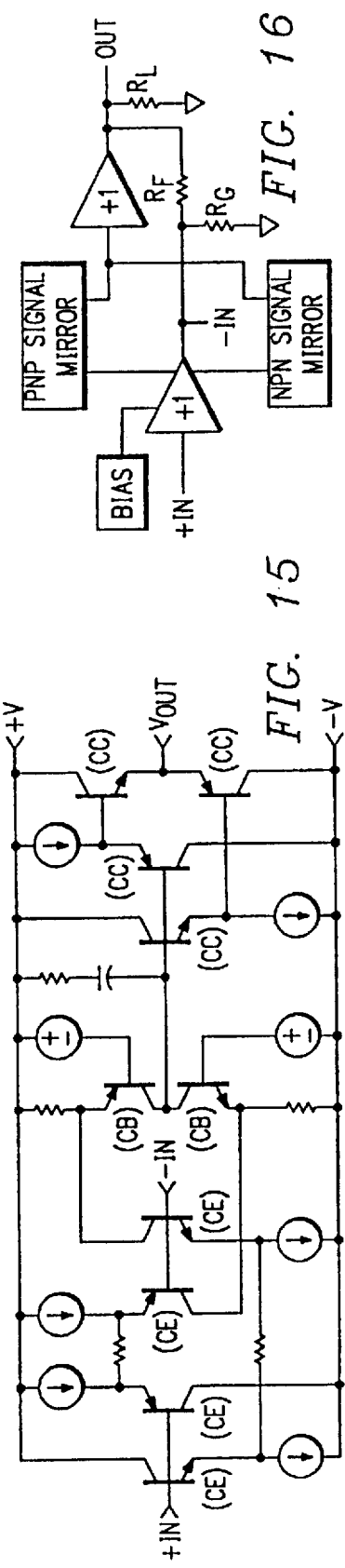
FIG. 16
FIG. 15

५,८९२,२६४

HIGH FREQUENCY ANALOG TRANSISTORS, METHOD OF FABRICATION AND CIRCUIT IMPLEMENTATION

This is a division of application Ser. No. 08/131,369, filed Oct. 4, 1993, U.S. Pat. No. 5,668,397.

BACKGROUND AND SUMMARY OF THE INVENTION

The present invention relates generally to the manufacture of integrated circuits and more specifically to complementary bipolar transistors having high Early voltage, high frequency performance, and high breakdown voltage characteristics. Evolution of these analog products parallels the industry trend for higher speed semiconductor devices and higher levels of functional integration. Historically, device architectures have been characterized by deep device junctions and have not minimized lateral device geometries. Furthermore, the limited variety of device types which can be fabricated with a given process has, in turn, limited the integration of analog and digital functions.

U.S. Pat. No. 4,665,425 to Piotrowski teaches the fabrication of vertical complementary bipolar transistors in dielectrically isolated islands. By forming vertical NPN and PNP transistors frequencies above 1 GHz have become achievable.

In order to attain higher frequency performance, it is necessary to decrease junction depths and lateral device dimensions. Junction depths can be reduced with self-aligned polysilicon emitters and the emitter-to-extrinsic base spacing can be reduced with an interposing dielectric spacer. A further advantage of polysilicon emitters is that they allow favorable trade-offs between current gain and Early voltage. U.S. Pat. No. 4,908,691 to Silvestri, et al. discloses an exemplary high frequency BiCMOS process. Vertical complementary bipolar transistors are formed in an integrated circuit having lateral dielectric isolation and junction bottom isolation.

It is an object of the present invention to provide a method of fabricating complementary bipolar transistors of still higher frequency.

Another object of the invention is to provide complementary bipolar transistors for high frequency analog applications characterized by increased current gain and Early voltage characteristics.

Still another object is to provide a method for manufacturing integrated circuits incorporating these higher performance complementary bipolar transistors.

According to a preferred embodiment of the invention there is now provided an integrated circuit with complementary bipolar transistors formed in electrically isolated islands having an Early voltage of at least 40 volts; a collector to base breakdown voltage of at least 12 volts; and a frequency response of at least 3 Ghz. Preferably, the transistors exhibit a current gain of at least 100 and a collector to emitter breakdown voltage of at least 12 volts. The base region should have a net peak dopant concentration at least 50 times larger than the net dopant concentration in the collector, and the collector width should be in the range of 0.7 to 1.5 microns. The net peak dopant concentration in the base region should be in the range of $4\times10^{17}$ cm$^{-3}$ to $2.0\times10^{18}$ cm$^{-3}$. The process also enables provision of field effect transistors having a frequency response of at least 4 Ghz.

An integrated circuit can be configured with these transistors to provide a feedback amplifier having a bandwidth of at least 45 Mhz and a slew rate of at least 2,000 volts per microsecond. The amplifier will operate at a maximum supply current of 25 milliamps and may be connected in the voltage feedback or current feedback mode.

Sample and hold circuits made with these amplifiers in a voltage feedback configuration will exhibit typical acquisition times on the order of 50 ns, to be compared with prior art 500 ns times for 12 bit resolution. In a current feedback configuration a typical 15 ns acquisition time is achievable at 12 bits of resolution with 200 MHz bandwidth. Typical slew rates of 150 volts per microsecond and 500 volts per microsecond are achievable for voltage and current feedback configurations, respectively. A digital to analog converter comprising transistors of the present invention will exhibit a typical settling time of less than 30 nanoseconds to one-half LSB with at least 11 bit resolution. Switches comprising these transistors will exhibit a rise and fall time of less than one nanosecond. When used with programmable current sources, the switches will produce a program current non-linearity of less than one percent.

The process forms complementary pairs of bipolar transistors each having similar base depths and similar distances from the base to a heavily doped buried collector region. These similar profiles are achieved with complementary impurities having similar diffusion coefficients in the base and buried collector regions. For a silicon process the preferred dopants are phosphorous and boron. Since these species each have an atomic radius smaller than that of silicon, impurity atoms having a larger atomic radius may be added to reduce stress within the active lattice structure. Such an impurity may be arsenic, antimony, or germanium. The concentration of stress reducing impurity is sufficiently low as to not detrimentally affect the net dopant concentration of the buried collector regions.

A double level polysilicon process for making the bipolar transistors is preferred. A first conductor level of polysilicon is selectively doped with impurities which are later outdiffused to the underlying crystal to form extrinsic base regions of the bipolar transistors. The same polysilicon level also forms collector conductors and collector contact regions. The first conductor level is covered with an insulative layer and patterned to expose intrinsic base regions prior to the drive-in. After extrinsic base formation, an insulating layer is formed at least on the exposed base areas and intrinsic base impurities are then introduced.

Lateral spacers are formed on side walls of the first level of conductors and the top insulative layer adjacent the intrinsic base areas to diminish the size of the opening and define the subsequently formed emitter region. The insulative layer on the intrinsic base area separates the spacers from the intrinsic base areas. By forming the spacers after forming the intrinsic base, the extrinsic base to emitter spacing can be increased while maintaining adequate intrinsic base to extrinsic base overlap. The increased emitter to extrinsic base spacing increases current gain and emitter to base breakdown voltage and reduces emitter junction leakage. Preferably, the insulative layer is oxide and the spacers are nitride. This eliminates undercutting of the spacer and provides better control of the extrinsic base to emitter spacing.

The second level of polysilicon is next formed on the wafer. Portions of this second polysilicon layer contacting the intrinsic base areas of the first N and P islands are selectively doped with N and P impurities respectively to form emitter contacts. The impurities are outdiffused from the emitter contacts to form the emitter regions.

The resulting spacer design and impurity profiles provide bipolar transistor structures having high frequency response, high Early voltage, high breakdown voltage and high current gain. The transistors are formed in isolated islands with minimum geometry to maximize density. The impurity concentration of the collector regions is kept low and the lateral dimensions of the emitter, base and collector are minimized.

Additional devices can be formed without requiring additional process steps. For example, a capacitor can be formed wherein the bottom plate is a region of the crystal layer and the top plate is the first polysilicon conductor. Resistors may be formed as thin films or in the substrate itself. JFETs and buried Zener diodes may also be formed without any additional processing steps.

Other objects, advantages and novel features of the present invention will become apparent from the following detailed description of the invention when considered in conjunction with the accompanying drawings.

BRIEF DESCRIPTION OF THE DRAWINGS

FIGS. 1–9 are cross-sectional views of a wafer during various stages of fabrication according to the principles of the present invention;

FIGS. 13 and 14 are cross-sectional views of a wafer during fabrication of heavily doped buried collector regions;

FIGS. 15 is a schematic of a voltage feedback amplifier circuits of the invention;

FIG. 16 is a block diagram of a current feedback amplifier incorporating the invention;

DETAILED DESCRIPTION OF THE INVENTION

Figure 1:
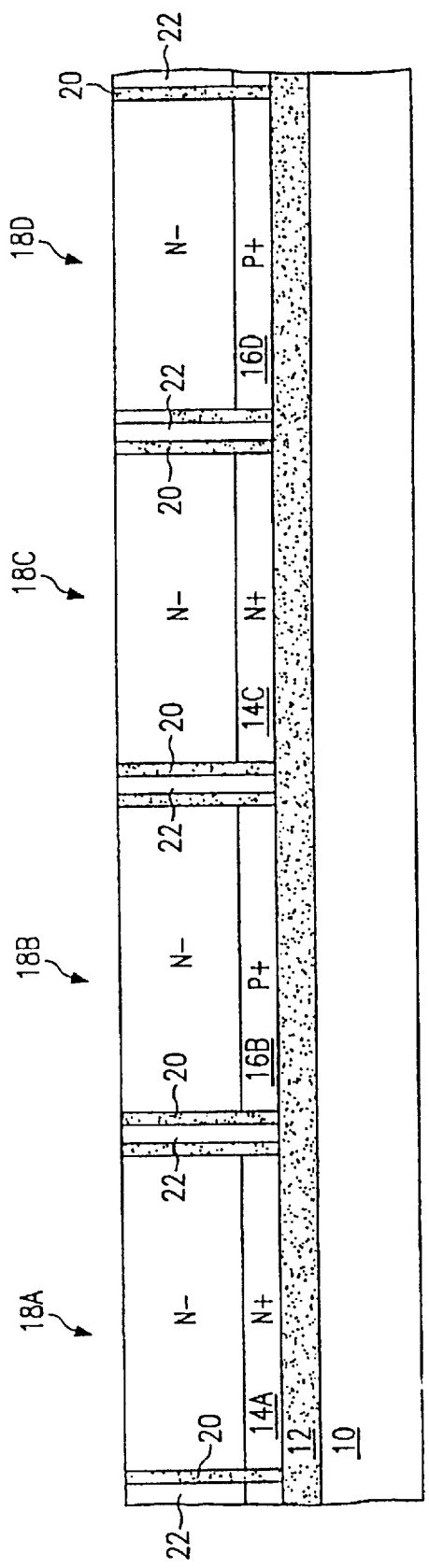

A preferred embodiment of the invention is now described with application to dielectrically isolated devices formed in silicon. Other isolation techniques, e.g., junction isolation, may be used as well as semiconductor materials other than silicon. FIG. 1 illustrates a stage in the fabrication process wherein heavily doped buried collector regions have been formed in more lightly doped silicon of several dielectrically isolated islands. The islands are electrically isolated from an underlying substrate 10 by a dielectric layer 12. The islands 18A–18D are of N-type conductivity having N⁻ buried regions 14 a and 14C and P⁺ buried regions 16B and 16D, respectively. Preferably, the N⁺ regions are phosphorus doped, and the P⁺ buried regions are boron doped. Since phosphorus and boron have very similar diffusion coefficients, the resulting complementary bipolar transistors have substantially matching collector widths. The ratio of the P and N impurity diffusion coefficients for the buried regions is in the range of 0.5 to 2.0. Lateral dielectric isolation is provided by trenches, the walls of which are lined with dielectric layers 20 and polysilicon 22.

The illustrated structure may be produced by wafer bonding, ZMR, SIMOX or other methods. One process flow would begin with an N layer formed over the dielectric layer 12. The buried layers 14A, 14C, 16B, and 16D may be formed with implants followed by epitaxial growth. The controlled epitaxial thickness is highly determinative in setting the desired distance between the transistor base and the buried collector layer of the invention. The preferred epi thickness ranges between 2.0 and 4.0 microns. The individual islands are formed by anisotropically etching trenches and forming an oxide layer 20 over the vertical trench sidewalls. As illustrated, the trenches may be filled with polysilicon 22. These and alternate process steps are well known and more fully illustrated in U.S. Pat. Nos. 4,900,689 to Bajor, et al; 4,929,566 to Beitman and 4,951,102 to Beitman, et al, all assigned to the assignee of the present invention and incorporated herein by reference.

The heavily doped regions 14 and 16 are formed with high concentrations of boron and phosphorus. Since these species have smaller atomic radii than silicon, substantial lattice defects can extend from this region of the crystal structure. If permitted, such defects would cause significant current leakage across junctions, thereby degrading analog performance characteristics in the transistors. Silicon has an atomic radius of 1.17 Å while boron and phosphorous have atomic radii of 0.88 Å and 1.10 Å, respectively. According to the invention, lattice strain, and resulting defects, are reduced by adding to the regions 14 and 16 impurities having larger atomic radii to offset the effects of boron and phosphorous on the lattice. Such impurities may be selected form the group consisting of arsenic, antimony, or germanium. For example, arsenic has an atomic radius of 1.18 Å.

As illustrated in FIG. 13, an N⁻ layer 13 is formed on the dielectric layer 12 of substrate 10. A larger dose of N type impurities, for example, phosphorous, has been selectively implanted and driven in to form regions 14A and 14C. Next, the strain relieving impurities, for example, arsenic, are introduced, e.g., by a blanket implant, overall into the layer 13. Finally, P-type impurities, for example, boron, are selectively implanted in regions 16B and 16D as shown in FIG. 14. The wafer is then heated to drive-in the arsenic and the boron. The resulting concentration of stress compensating impurities should not significantly counter dope any of the regions formed. For example, the N type arsenic implant should be one tenth to two tenths the P type boron dose used to form the buried regions 16B and 16D.

With the heavily doped regions established, an NPN transistor will be formed in island 18A, a PNP transistor will be formed in island 18B, a buried Zener diode will be formed in island 18C and a capacitor will be formed on island 18D.

Figure 2:
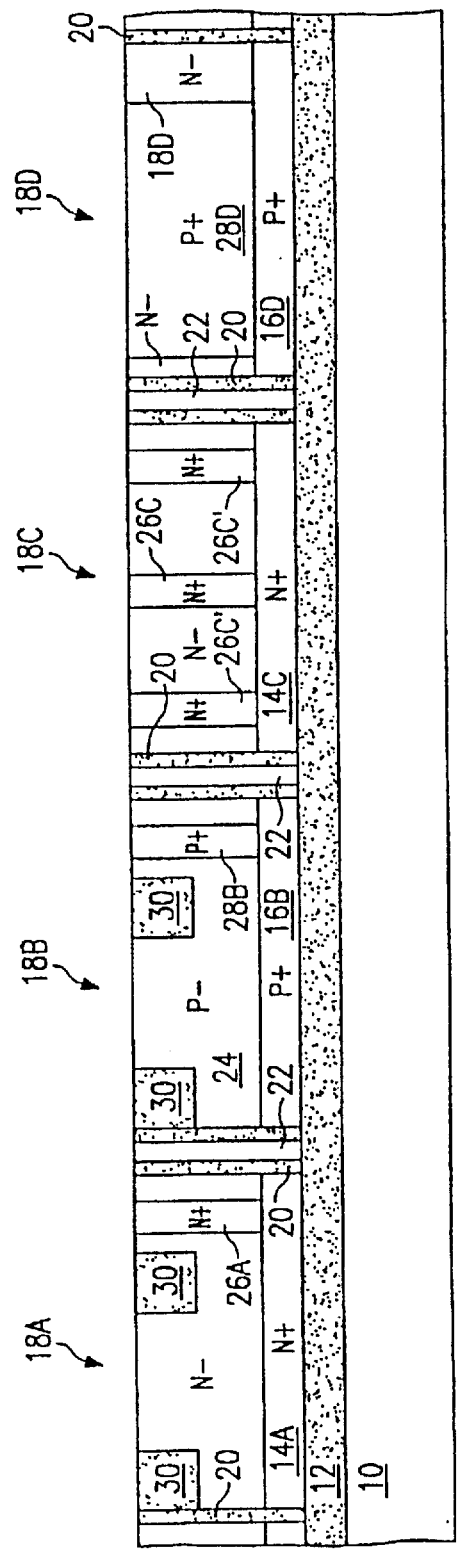

To form the collector region of the PNP transistor, P type impurities, for example boron, are introduced by ion implantation into island 18B. To form contacts to the buried regions 14A and 16B, N type impurities, for example phosphorus, are introduced into island 18A and P conductivity type impurities, for example, boron, are introduced into island 18B. Island 18C receives a N⁻ implant to simultaneously form one element of a junction Zener diode and a buried contact to the buried $N^+$ region 14C. A P-type implant in island 18D forms a bottom capacitor plate. The wafer is then heated in the range of 1000° C. to 1200° C. for a period of ½ hour to 3 hours to drive-in all the P and N buried contacts as well as the front collector implants to link up with the respective buried $N^+$ and $P^+$ regions. As illustrated in FIG. 2, this results in $N^+$ collector contact 26A, $P^+$ collector contact 28B, $N^+$ Zener diode region 26C, the buried contact regions 26C', and $P^+$ capacitor bottom plate region 28D. The $P^-$ collector region 24 is also formed in island 18B.

Preferably the $N^-$ regions of the islands 18A, 18C and 18D have an impurity concentration in the range of $3\times10^{15}$ $cm^{-3}$ to $9\times10^{15}$ $cm^{-3}$ or a bulk resistivity in the range of 0.4 ohm-cm to 1.3 ohm-cm. The $P^-$ collector region 24 is formed by implanting a dose ranging between $1\times10^{12}$ $cm^{-2}$ and $8\times10^{12}$ $cm^{-2}$ at an energy in the range of 200 Kev to 700 Kev. This results in a collector net impurity concentration ranging from $6\times10^{15}$ $cm^{-3}$ to $2\times10^{16}$ $cm^{-3}$. The dose of the N-type implant which forms regions 26 is in the range of $5\times10^{14}$ $cm^{-2}$ to $5\times10^{15}$ $cm^{-2}$ at an energy of 50 Kev to 200 Kev. The resulting $N^+$ contacts the diode region 26 have an impurity concentration in the range of $2\times10^{18}$ $cm^{-3}$ to $2\times10^{19}$ $cm^{-3}$. Similarly, the $P^+$ contact and plate region 28 are formed with an implant dose of $5\times10^{14}$ $cm^{-2}$ to $5\times10^{15}$ $cm^{-2}$ at an energy of 50 Kev to 200 Kev. The resulting $P^+$ contacts 28 to the buried regions 16 have an impurity concentration in the range of $2\times10^{18}$ $cm^{-3}$ to $2\times10^{19}$ $cm^{-3}$.

With standard LOCOS techniques, a thick recessed oxide region 30 is formed in the islands to define active device areas. The resulting structure is only schematically illustrated in FIG. 2 to show that the oxide regions 30 separate the collector contacts from the active base regions. The recessed oxide reduces the base to collector capacitance.

A high quality thin oxide layer 32 is thermally grown on the surface of the substrate to a thickness of 500 Å to 2500 Å. The thin oxide layer 32 is then patterned and etched to expose the base regions, the Zener region, the contact regions of FIG. 2 and a contact opening to the bottom capacitor plate region 28D. A remaining portion of layer 32 over plate region 28D serves as the capacitor dielectric.

Figure 3:
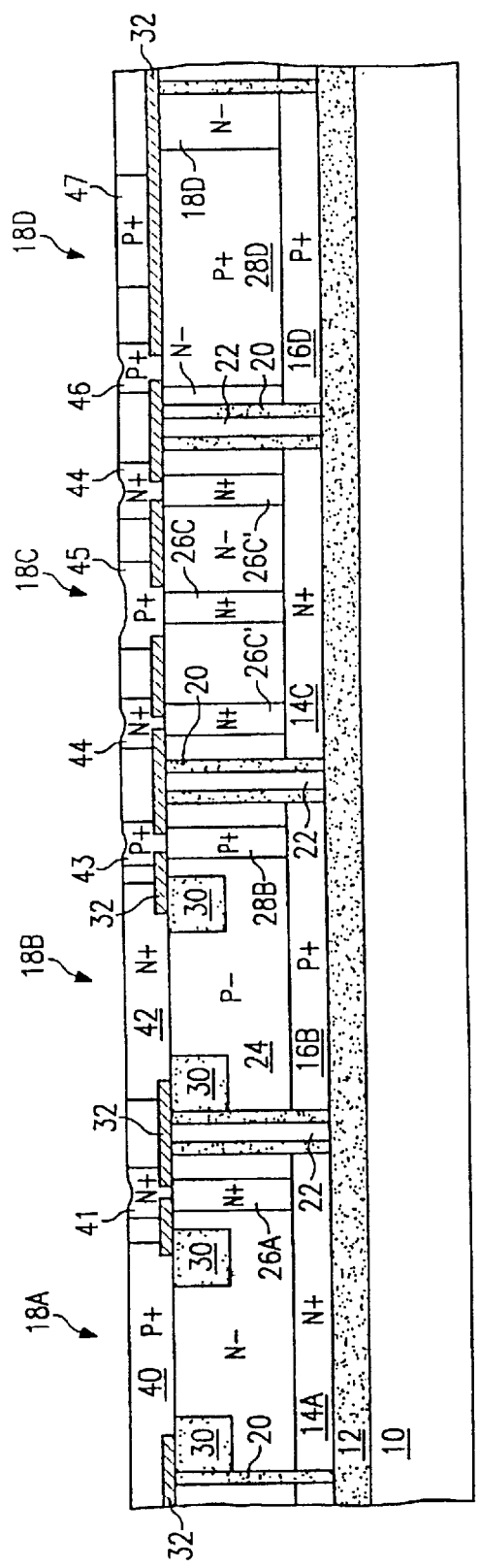
Figure 4:
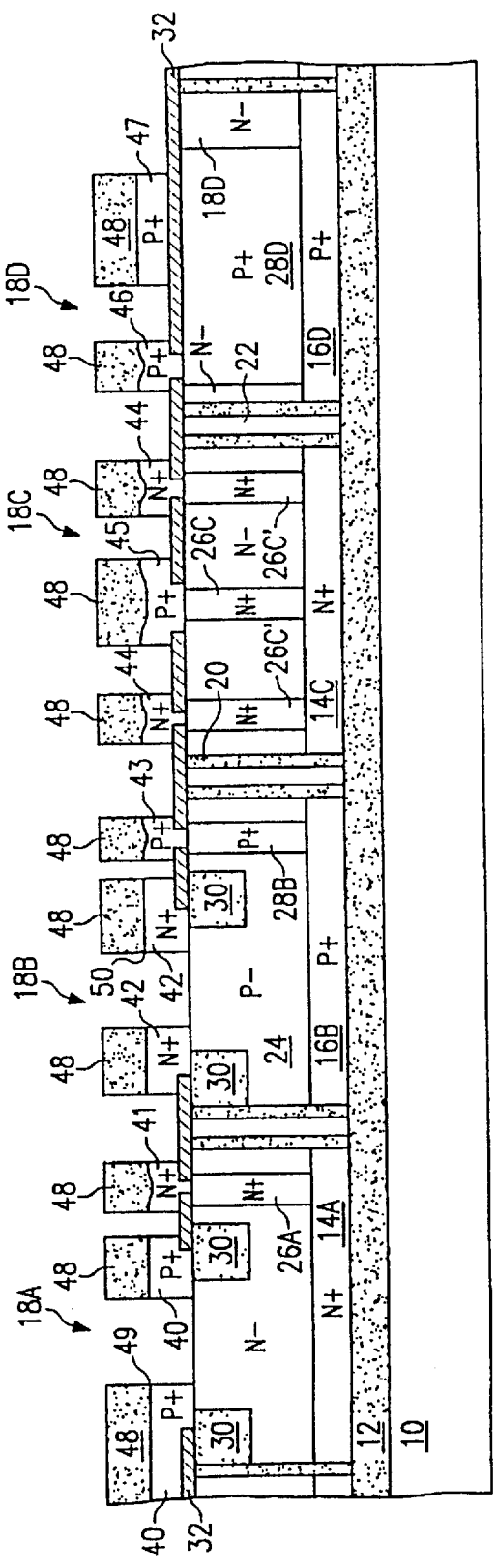

A first conductor layer of undoped polysilicon is then deposited; selectively doped with a heavy implant; then patterned and etched to simultaneously form, as illustrated in FIGS. 3 and 4, base contacts 40 and 42, collector contracts 41 and 43, Zener diode contact 44, anode contact 45, bottom capacitor plate contact 46 and top capacitor plate 47.

This is followed by the formation of a thick insulative layer 48, e.g., deposited oxide. The layer 48 and the first level of polysilicon are patterned to form contacts and intrinsic base openings. That is, as shown in FIG. 4, portions of the base contact regions 40 and 42 and overlying portions of the dielectric layer 48 are removed to form openings 49 and 50 which expose the intrinsic base portions of the islands 18A and 18B respectively. A plasma etch provides nearly vertical side walls to the openings 49 and 50 and minimizes overetch into the silicon where the intrinsic base regions will be formed.

Figure 5:
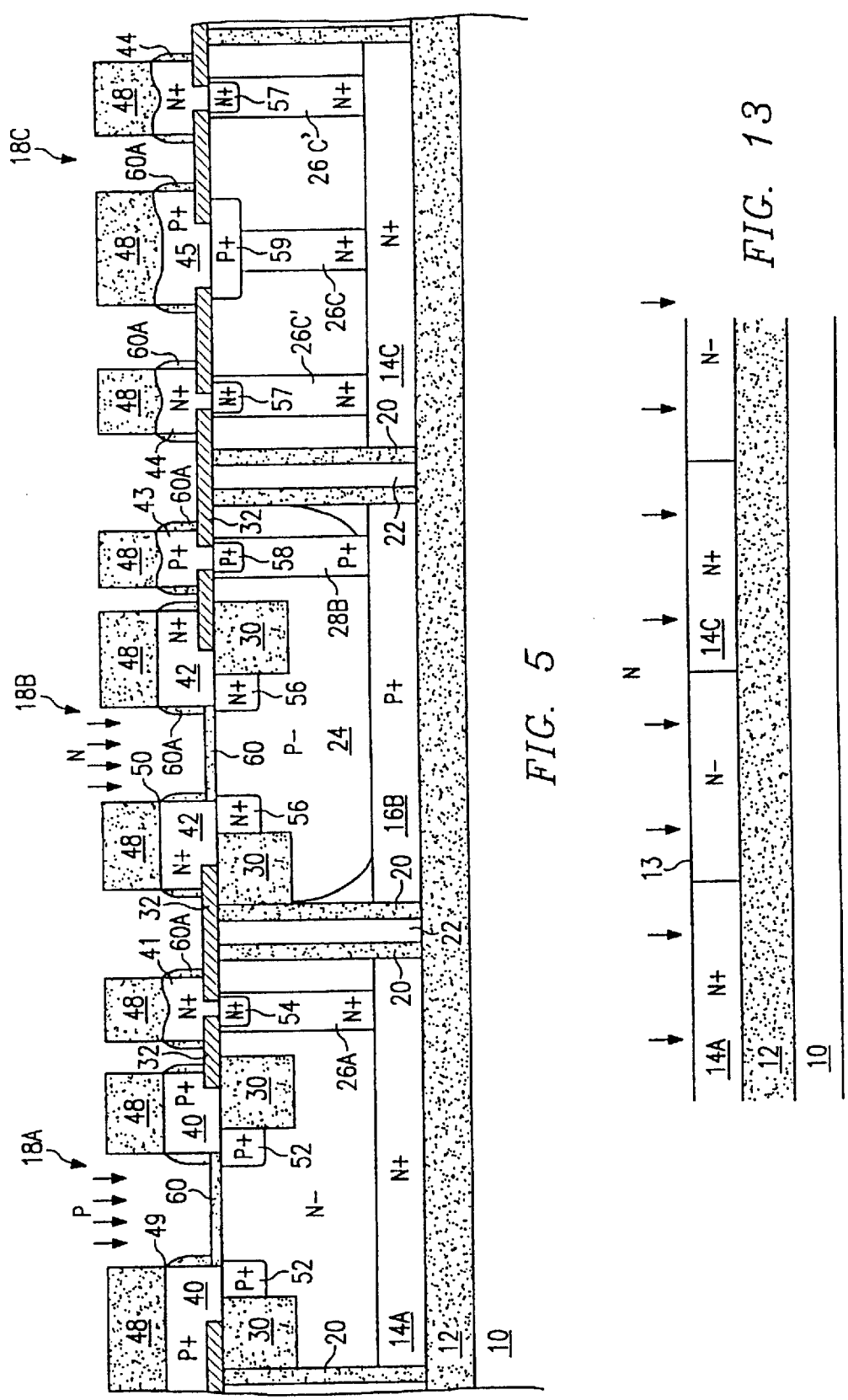
Figure 6:
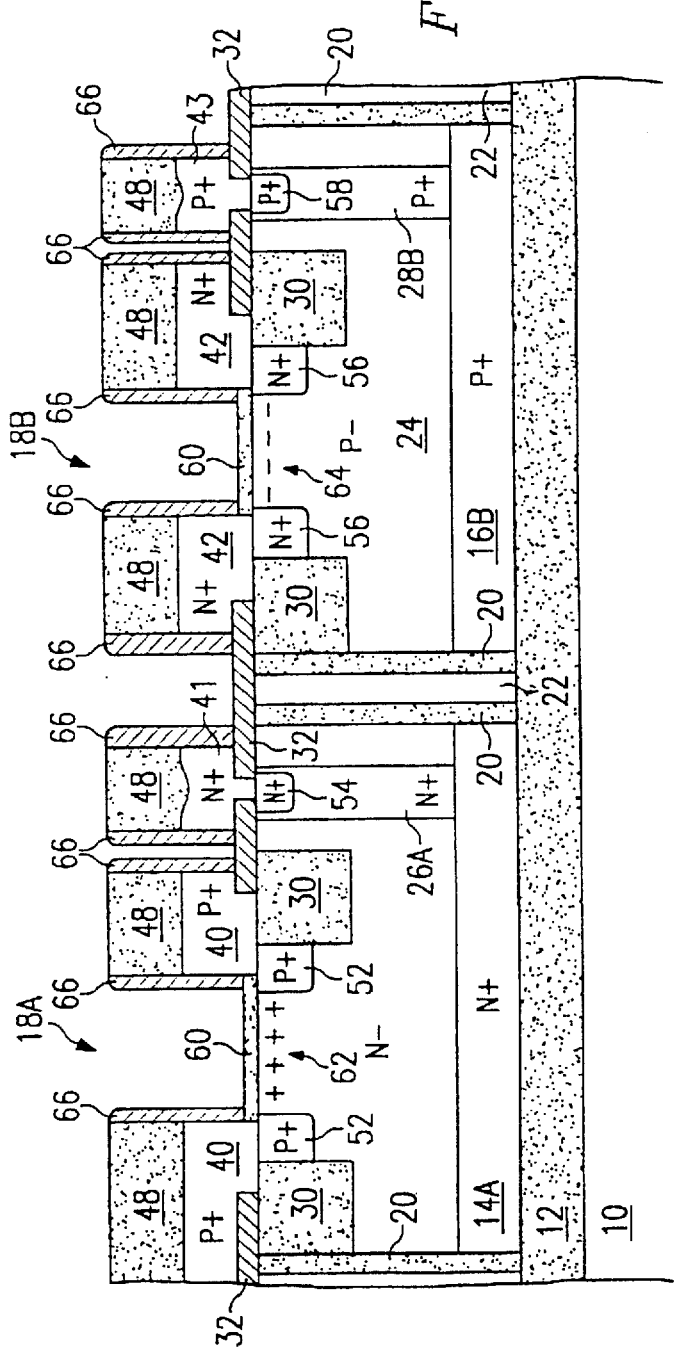

Referring next to FIG. 5, impurities from the first layer of polysilicon are diffused into the single crystalline islands to produce extrinsic base portions 52 and 56 and sustain ohmic contact portions 54, 56 and 57 in the collector contact regions. In addition, the diffusion step provides a buried Zener junction between previously formed cathode region 26C and an anode region 59 formed form the polysilicon layer 45. An ohmic contact portion similar to the contact portion 58 is also formed in the contact region 28D of the capacitor (not illustrated in FIGS. 5–9). Outdiffusion into the ohmic contact portions compensates for any loss in dopant concentration along the surface which may result from the diffusion process.

During this diffusion, a thin oxide layer 60 is formed on the exposed intrinsic base areas. This oxide serves as a screen for future implants and consumes some of the crystal material which may have been damaged when etching the openings 49 and 50. Simultaneously, a thin sidewall oxide element 60A is formed along exposed portions of the first polysilicon layer as shown in FIG. 5. For simplicity of illustration, the sidewall element 60A along the first polysilicon layer is not illustrated in subsequent figures.

To form the P-type extrinsic base regions 52, a $5\times10^{15}$ $cm^{-2}$ dose of boron is implanted at an energy in the range of 50 Kev. To form the N-type extrinsic base regions 56, a $5\times10^{15}$ $cm^{-2}$ dose of phosphorus is implanted at an energy level in a range of 100 Kev. The implants are driven in at a temperature of 900° C. to 1050° C. for a period of ½ hour to 3 hours to produce diffused $P^+$ and $N^+$ regions. The $P^+$ regions 52 have a net dopant concentration of $1\times10^{18}$ $cm^{-3}$ to $1\times10^{20}$ $cm^{-3}$ and a depth of 1000 Å to 5000 Å. The $N^+$ regions 56 have net dopant concentrations in the range of $1\times10^{18}$ $cm^{-3}$ to $1\times10^{20}$ $cm^{-3}$ and a depth in the range of 1000 Å to 5000 Å. Preferably the first polysilicon layer has a thickness in the range of 1000 Å to 5000 Å0 and the insulative layer 48 has a thickness in the range of 2000 Å to 6000 Å. The thin oxide layer 60 has a thickness in the range of 200 Å to 1000 Å.

A complete description of different formation of buried Zener diodes and their operation is discussed in U.S. Pat. Nos. 4,398,142 to Beasom and 4,652,895 to Roskos, also incorporated herein by reference. Combinations of steps of the present process may be used to form the structure as illustrated therein.

As illustrated in FIG. 5, P type impurities and N type impurities are selectively implanted through the openings 49 and 50 to form intrinsic base regions 62 and 64 in islands 18A and 18B, respectively. See FIG. 6.

To isolate the first level polysilicon conductors, and the diffused extrinsic base regions from emitter conductors (to be formed with a subsequent level of polysilicon), side wall spacers are formed along the edge of the first level polysilicon adjacent the emitter openings. Briefly, a nitride layer is deposited over the oxide layer 60 and then anisotropically etched to form self-aligned insulative spacers 66 along the sides of all the openings in the polysilicon layer. The spacers extend from the first insulative layer 48 to the oxide layer 60. Nitride is the preferred spacer material for reasons discussed below. A feature of the process is that the spacer forms a narrower polysilicon opening to define the emitter region, effectively narrowing the emitter dimension. This reduces the emitter-base junction area, thereby increasing the speed of the resulting transistor.

According to the invention, implants for the intrinsic base regions 62 and 64 are performed after etching the first level of polysilicon and before the spacers 6 are formed. This is advantageous over a process sequence which introduces the intrinsic base implants after spacer formation. That is, with the intrinsic base implants performed prior to spacer definition there is assurance that the heat treatments used to drive in the intrinsic and extrinsic base implants provide sufficient overlap of the diffused regions, i.e., a linkage area sufficiently doped to prevent punch through of the base when the collector-base junction is reverse biased.

Since the spacer 66 is formed all along the sidewall of the first polysilicon level, it will separate the subsequently formed emitter region 74 (or 80) from the edge of the first polysilicon level. With the extrinsic base implants occurring prior to spacer formation, a feature of the present process is that the subsequent emitter implants are aligned with respect to the spacers 66. Also, since the extrinsic base region 52 (or 56) is formed by outdiffusing dopant from this first polysilicon level, the net separation distance from the emitter to the extrinsic base region is predominantly determined by the width of the spacer less the length of the lateral diffusion of the extrinsic base. By implanting the intrinsic base prior to forming the spacers, the amount of lateral diffusion of the extrinsic base required to link up with the intrinsic base can be minimized. Thus, the resulting space between the extrinsic base and the emitter is a desirably large separation distance which maximizes the current gain and breakdown voltage of the emitter-base junction; and minimizes emitter-base leakage current. In summary the preferred process provides the most desirable bipolar transistor characteristics, e.g., high breakdown voltage and low leakage current, for high frequency analog applications.

Another feature of the preferred process is that the spacers 66 can be defined without damaging the implanted intrinsic base regions. The possibility of etching into the underlying silicon of the intrinsic base during spacer formation is to be avoided because this would remove the implanted dose in an uncontrolled manner. That is, important analog transistor parameters such as current gain, Early voltage, and breakdown voltage would be affected by changes in the integrated dopant concentration of the intrinsic base. The present process prevents degradation of these device parameters by using the oxide layer 60 as an etch stop during spacer formation.

According to the preferred process, the thin oxide layer 60 is grown before implanting the intrinsic base and depositing the spacer 66. Known dry etch technology is sufficiently selective with respect to oxide that the nitride spacers 66 can be repeatably etched in a manufacturing environment without etching through the oxide layer 60. Thus, the silicon under the nitride/oxide sandwich is not damaged. Within the spacer opening, remaining oxide from the layer 60 is subsequently removed with a wet etchant. For example, a buffered HF solution is extremely selective with respect to both silicon and nitride. Thus, the integrity of the intrinsic base implant is sustained. As indicated in FIG. 7, a residual filament of the oxide layer remains under the spacers 66 after the wet etch step. This filament assures electrical isolation between the polysilicon base contact regions and the emitter regions 74, 80.

Another advantage of having the thin oxide region 60 interposed between the nitride spacer and the intrinsic base region is that the quality of the silicon surface is maintained. Nitride films in direct contact with silicon will characteristically induce interface traps and recombination centers at the silicon surfaces. These interface traps and recombination centers will degrade current gain at low collector current levels. A shown in FIG. 7 the filament of high quality, interposing thermal oxide region 60 remaining after wet etch will prevent this degradation from occurring.

Figure 8:
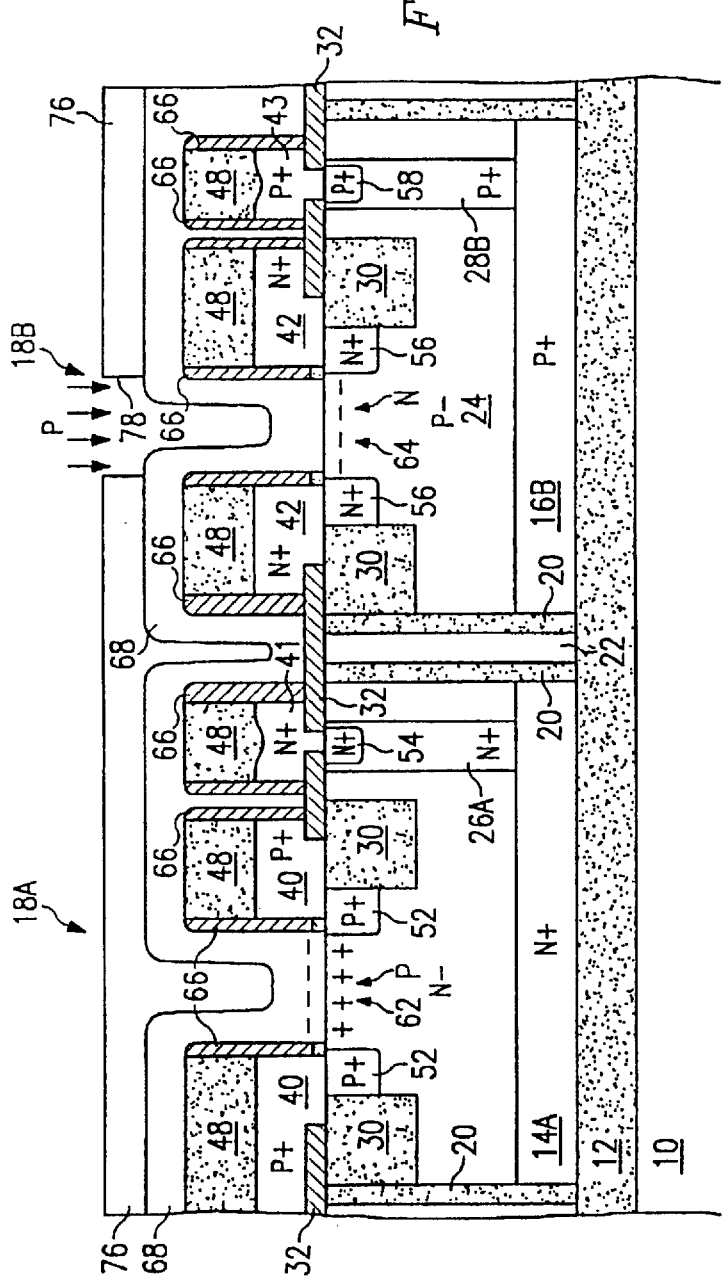
Figure 9:
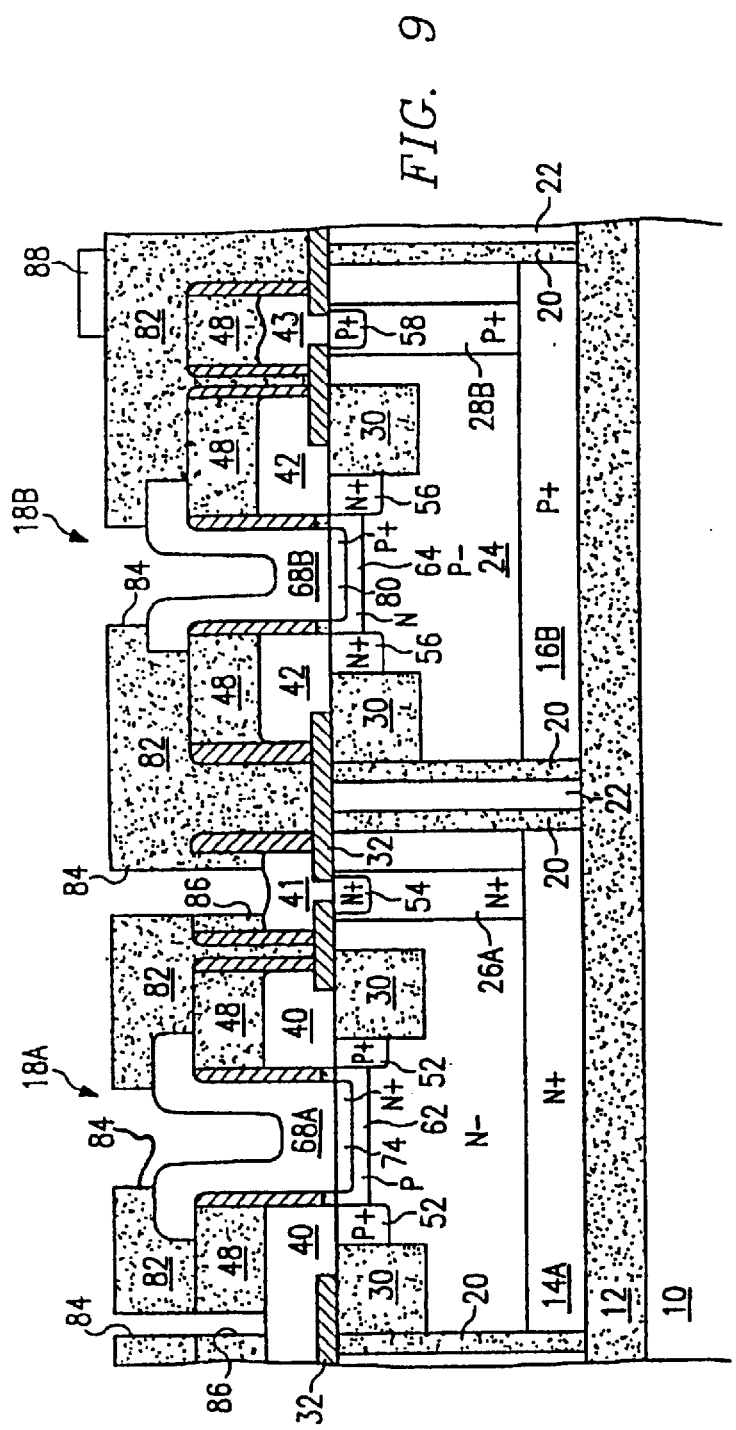

A second conductor layer of polysilicon 68 is formed over the substrate, as illustrated in FIG. 7, contacting the exposed base regions of islands 18A and 18B. Patterned photoresist 70 provides an opening 72 to expose the portion of the second polysilicon layer 68 contacting the base region 62 of the NPN transistor. N-type impurities are introduced to the exposed polysilicon. The photoresist 70 is then removed and a second mask of photoresist 76, shown in FIG. 8, provides an opening 78 to expose the portion of the second polysilicon layer 68 contacting the base region 64 of the PNP transistor. P-type impurities are introduced to the exposed polysilicon. Referring now to FIG. 9, the second polysilicon layer 68 is patterned and etched to leave doped polysilicon contacts 68A and 68B. Next, the surface is covered with a patterned insulative layer 82, leaving the doped polysilicon contacts 68A and 68B exposed. The wafer is then heated to out-diffuse the implants from the second polysilicon layer into the underlying silicon. The resulting $N^+$ emitter region 74 and $P^+$ emitter region 80 are shown in FIG. 9. Simultaneously, the ion implanted intrinsic base impurities are driven in to define P intrinsic base region 62 and N intrinsic base region 64.

Alternately, two heat processing steps can be performed. After the N impurities are ion implanted, a first heating step is performed. After the P impurities are ion implanted, the second polysilicon layer 68 is patterned and the second insulative layer 82 is applied. Preferably the layer 82 is heavily doped, e.g., BPSG. This is followed by a second heating step.

The P type implant which forms the intrinsic base region 62 is, for example, boron with a dose in the range of $5\times10^{12}$ $cm^{-2}$ to $5\times10^{13}$ $cm^{-2}$ and implanted at an energy of 5 Kev to 40 Kev. The N type intrinsic base region 64 may be formed with a phosphorus implant having a dose in the range of $5\times10^{12}$ $cm^{-2}$ to $5\times10^{13}$ $cm^{-2}$, and implanted at an energy of 40 Kev to 90 Kev. The -N type implant which forms the emitter 74 is, for example, an arsenic dose in the range of $5\times10^{15}$ $cm^{-2}$ to $2\times10^{16}$ $cm^{-2}$ implanted at an energy of 50 Kev to 150 Kev. The P-type implant which forms the emitter 80 is, for example, a boron dose in the range of $5\times10^{15}$ $cm^{-2}$ to $2\times10^{16}$ $cm^{-2}$ and implanted at an energy of 30 Kev to 80 Kev.

The first heating step is performed in the temperature range of 900° C. to 1100° C. for a period of one to 45 minutes and the second heating step is performed in the range of 850° C. to 1000° C. for one to 45 minutes. The resulting P intrinsic base region 62 has a peak net dopant concentration in the range of $4\times10^{17}$ $cm^{-3}$ to $1\times10^{18}$ $cm^{-3}$ and a depth of 2000 Å to 4000 Å. The N intrinsic base region 64 has a net peak dopant concentration in the range of $7\times10^{17}$ $cm^{-3}$ to $2\times10^{18}$ $cm^{-3}$ and a depth in the range of 2000 Å to 4000 Å. The $N^-$ emitter region 74 has a net dopant concentration in the range of $1\times10^{19}$ $cm^{-3}$ to $1\times10^{20}$ $cm^{-3}$ with a depth in the range of 200 Å to 1000 Å and the $P^+$ emitter region 80 has a net dopant concentration in the range of $1\times10^{19}$ $cm^{-3}$ to $1\times10^{20}$ $cm^{-3}$ with a depth ranging from 200 Å 1000 Å.

The resulting complementary bipolar transistor structure has substantially matched base widths in the range of 0.15 to 0.35 microns and substantially matched collector widths in the range of 0.70 to 1.5 microns for an epitaxial layer thickness of 2.0 to 4.0 microns.

The ratio of collector widths between the NPN transistor of island 18A and the PNP transistor of island 18B should be in the range of 0.75 to 1.3. This minimizes the collector series resistance while supporting a breakdown voltage greater than 12 volts. These ratios become possible when phosphorus is used for the N buried region and N base region (instead of arsenic or antimony), and boron is used for the P buried region and P base region. Since boron has a diffusion coefficient very similar to phosphorus, the resulting collector widths are similar.

Apertures 84 and 86 are etched in the insulative layer 82 and the insulative layer 48 before the second heat treatment. By forming the apertures before the second heat treatment a BPSG layer 82 provides smoother topology. After aperture formation, a thin film resistor 88 may be formed with a conventional photoresist lift off technique. This can be followed by forming two metal layers of interconnect.

Figure 10:
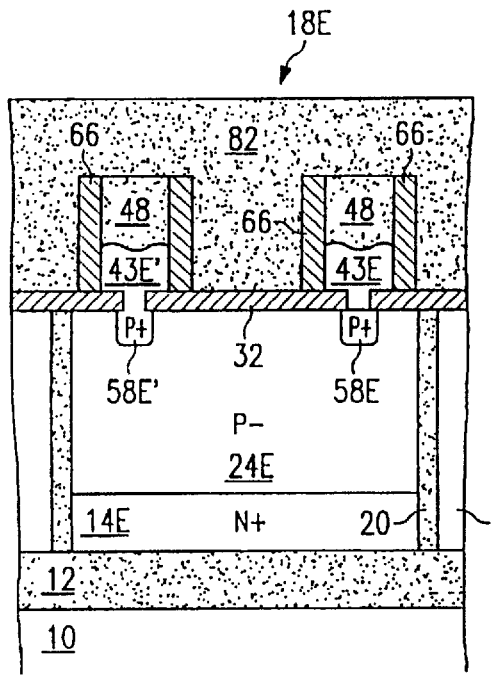
FIG. 10 is a cross-section of a diffused resistor incorporating the principles of the invention.

FIG. 10 illustrates a P-type island 18E wherein other resistor structures may be formed. A P⁻ region 24E is formed at the time the collector region 24 of FIG. 2 is formed for the PNP transistor in island 18B. P⁺ ohmic contacts 58E and 58E' are formed in the P⁻ region by outdiffusion of impurities from the first level polysilicon conductors 43E and 43E' formed simultaneously with the collector contact 43. Thus the island region 18E provides a resistor region.

Figure 11:
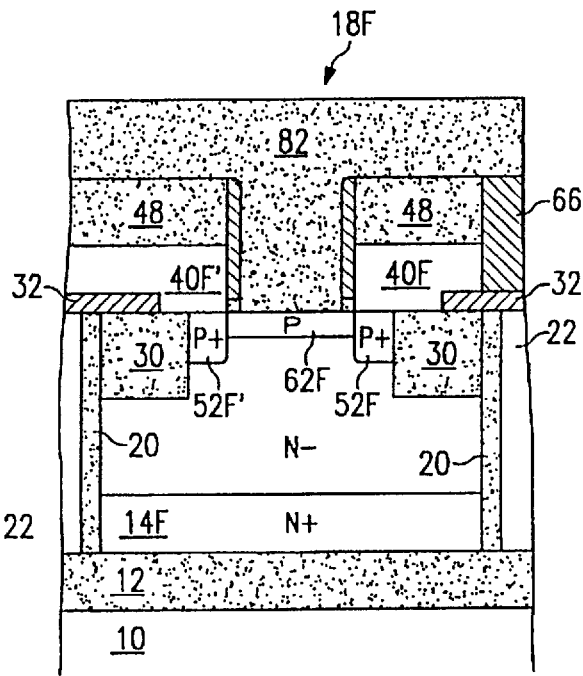
FIG. 11 is a cross-section of an alternate embodiment diffused resistor incorporating the principles of the invention.

A lower resistance, diffused resistor is illustrated in FIG. 11. An N island 18F having a buried region 14F has extrinsic resistor contact regions 52F and 52F' formed by out diffusion from resistor contacts of the first level polysilicon layer 40F and 40F'. The intrinsic resistive portion 62F is formed simultaneously with the formation of the intrinsic base portion of the NPN transistor. Additionally, polysilicon resistors may also be formed on the integrated circuit by selectively doping either of the two polysilicon layers.

Figure 12:
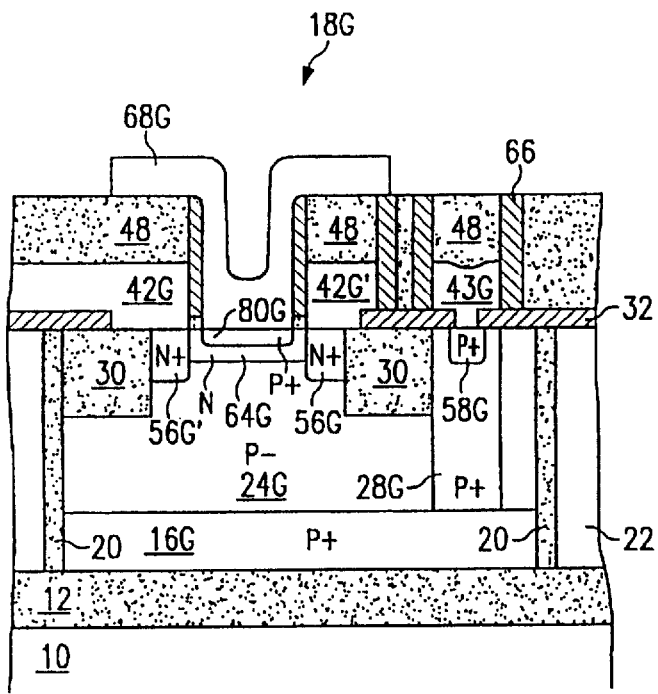
FIG. 12 is a cross-sectional view of a JFET incorporating the principles of the invention.

Junction field effect transistors, JFETs, may be formed alongside the bipolar devices without requiring any additional process steps. As illustrated in FIG. 12, a P⁻ island 18G, having a P⁺ buried layer 16G and P⁻ region 24G, includes a P⁻ bottom gate contact region 28G formed simultaneously with the buried collector contact region 28B of FIG. 2. The P⁻ region 24G forms the bottom gate. The N⁺ source and drain regions 56G and 56G' are formed by outdiffusion from source and drain conductors 42G and 42G' formed from the first polysilicon layer. The P⁺ contact region 58G is formed by outdiffusion from the first level polysilicon. The N channel region 64G is formed simultaneously with the intrinsic base 64 of FIG. 9. The P⁺ top gate 80G is formed by outdiffusion from a top gate contact 68G during formation of the emitter 80. The recessed dielectric isolated regions 30 are also provided in the bottom gate region 24G. A bottom gate contact 43G is also derived form the first polysilicon layer.

Achievable performance characteristics of an NPN and a PNP transistor formed according to the principles of the present invention are as follows:

| Parameter | NPN | PNP |
| --- | --- | --- |
| Ft | >7.0 GHz | >3.0 GHz |
| Current Gain | >100 | >100 |
| Early Voltage | >60 V | >40 V |
| 3V$_{C30}$ | >12 V | >12 V |
| 3V$_{C30}$ | >12 V | >12 V |

The JFETs will have the following characteristics:

| Parameter | NJFET |
| --- | --- |
| Ft | >4.0 GHz |
| Vp | >0.5 V |
| BVdss | >5.5 V |

As will be noted, an attempt has been made to optimize the frequency response along with the Early voltage and breakdown voltages. This is more critical in analog applications than just the frequency response Ft. In digital applications, the above device considerations are not nearly as critical. Some representative parameter ranges for analog and digital transistors are:

| Parameter | Analog | Digital |
| --- | --- | --- |
| Early voltage | >40 V | >3 V |
| Leakage | <100 nA | <100 μA |
| Noise | <100 nv/rt-Hz | <1000 nv/rt/Hz |

The spacing between the base and buried layer of a transistor has a significant influence on the collector-base breakdown voltage BV$_{CBO}$, Early voltage, series collector resistance Rcs, and consequently, the frequency response Ft of the transistor. Unfortunately, breakdown voltage and Early voltage are tradeoffs against Rcs and Ft. In an analog application, proper control of each of these parameters is important, and, therefore, the space between the base and buried layer must be carefully designed. This becomes more difficult to accomplish in a complementary process because there are two such spacings to design and control. By using boron and phosphorus for the buried regions and the base regions, matched collector widths are possible. This provides lower collector series resistance while maintaining the collector-base breakdown voltage greater than 12 volts.

Some of the advantages of introducing the intrinsic base prior to spacer formation are as follows. Control over the depth and lateral diffusion of the extrinsic base becomes less critical because the intrinsic base is introduced in relatively close proximity to the extrinsic base prior to formation of the spacer 66; and the emitter implant is performed after spacer formation so that the extrinsic base can be kept relatively far away from the emitter. Among other benefits, this arrangement sustains a higher current gain and a higher emitter to base breakdown voltage. Control over the width of the spacer becomes less critical because of the increased distance possible between the extrinsic base and the emitter.

The use of a nitride spacer separated from the islands by a thin oxide provides the following benefits to analog transistors. The control of current gain, Early voltage, and breakdown is not affected by the potential removal of silicon by the plasma etch. The leakage of the emitter-base junction is lower because the silicon surface is not damaged by the plasma. The noise of the transistor is less, again due to the silicon not being damaged.

The thin oxide 32, which forms the dielectric of the capacitor and also covers the surface of the islands, is created early in the process immediately prior to the deposition of the first polysilicon. This protects the surface of the islands as well as the purity of the dielectric of the capacitor and thereby improves its performance and reproducibility.

The present invention offers a unique combination of features not previously achievable in a single process and provides capability for designing and developing products that extend the state of the art in the circuit performance. Enhanced frequency response, Early voltage and breakdown voltage provide the products with higher levels of performance at higher frequencies while maintaining or improving the DC characteristics and minimizing power dissipation. For a given current level, a 60 volt NPN Early voltage and a 40 volt PNP Early voltage, this complementary bipolar process offers about a ten-fold improvement in circuit frequency response over devices made with former processes. The capability is now provided for developing products with higher AC performance at a given level of power dissipation. Conversely, for a given frequency the power consumption can be reduced significantly.

The traditional operational amplifier is known as a voltage feedback amplifier and its application is in virtually all electronic systems. A specific family of operational amplifiers, referred to as high speed, are required in RF, signal processing, communications, medical/industrial imaging, and video systems. Voltage feedback amplifiers are better suited as active filters and integrators than current feedback amplifiers. A comparison of operating characteristics for prior art voltage feedback amplifiers with characteristics of amplifiers constructed with the present invention (FIG. 15) follow.

| Parameter | Prior Art | Present Invention |
|---|---|---|
| Unity Gain Bandwidth | 350 MHz | 700 MHz |
| Slew Rate | 1000 V/$\mu$s | 2500 V/$\mu$s |
| Settling Time (0.1%) | 20 ns | 6 ns |
| Supply current | 40 mA | 20 mA |

A current feedback amplifier incorporating bipolar transistors of the present invention will have the following characteristics and is illustrated in block diagram form in FIG. 16.

| Parameter | Prior Art | Present Invention |
|---|---|---|
| −3 dB Bandwidth | 150 MHz min. | 500 MHz min |
| Output Voltage | +/−3 Vpp into 100 ohm | +/−3 Vpp into 100 ohm |
| Supply Current | 18 mA max | 24 mA max |
| Slew Rate | 1600 V/$\mu$s | 2000 V/$\mu$s min |

From the above characteristics, it has been shown that a feedback amplifier incorporating the present integrated circuits has a bandwidth of at least 500 MHz and a slew rate of at least 2000 volts per microsecond. Also, the maximum current is below 24 milliamps, and the current feedback amplifier has a settling time of less than 20 ns.

Figure 17:
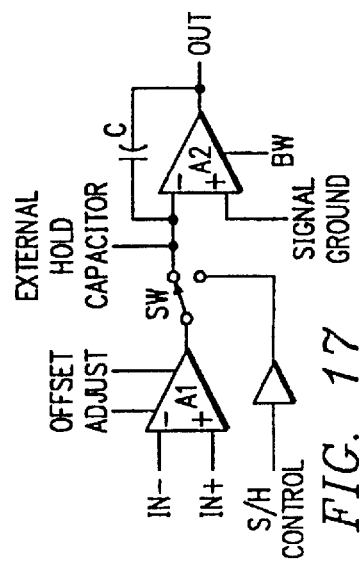
FIG. 17 is a block diagram of sample and hold circuitry incorporating transistors according to the invention.

The voltage feedback or current feedback amplifiers may be used to improve the performance of a sample and hold amplifier. A typical implementation is illustrate din FIG. 17 as including an input transconductance amplifier A1, a low leakage voltage switch SW, and an output integrating amplifier A2. This switch SW is controlled through a sample and hold gate. In previous designs A1 and A2 were voltage feedback amplifiers. With this process the circuit of FIG. 17 can be configured with either voltage or current feedback amplifiers having the following improved typical characteristics.

| Parameter | Prior Art | Voltage Feedback | Current Feedback |
|---|---|---|---|
| Acquisition Time | 500 ns | 50 ns | 15 ns |
| Slew Rate | 90 V/$\mu$s | 150 V/$\mu$s | 500 V/$\mu$s |
| Bandwidth | 4.5 MHz | 45 MHz | 200 MHz |
| Resolution | 12 bits | 12 bits | 12 bits |

Figure 18C:
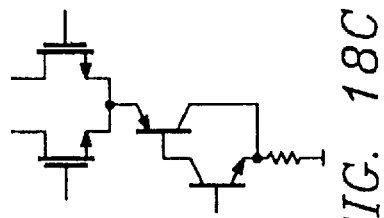
FIG. 18A is a prior art cell of a digital to analog converter and FIGS. 18B and 18C are cells of a digital to analog converter incorporating the invention.
Figure 18B:
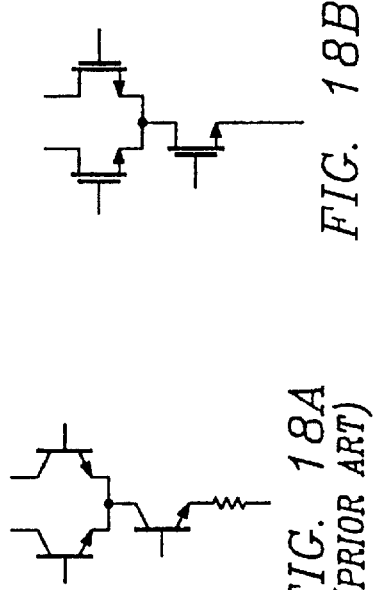
Figure 18A:
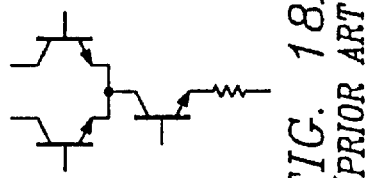

Prior digital to analog converters (DACs) have achieved greater than 12 bit resolution by incorporating super Beta transistors and an operational amplifier in a servo loop (not illustrated). A typical prior art cell is illustrated in FIG. 18A. The speed of the DAC is limited by the bandwidth of the operational amplifier, the capacitance of the R-2R ladder, and the frequency response of the transistors. The superior frequency response provided according to the invention increases the bandwidth of the operational amplifier output by ten-fold for a given power level. Referring to FIG. 18B the super Beta device is replaced with an N channel JFET providing approximately a ten-fold speed advantage. If the transconductance of the JFET is insufficient to achieve 12 bit match in the DAC cell current source, the PNP/NPN combination shown in FIG. 18C can be used. The R-2R ladder can be eliminated thereby reducing capacitance by using a fully scaled design, e.g., ratioing device sizes between adjacent cells. This is made possible by smaller lithography. A comparison of the settling times to the one-half LSB is as follows.

| Parameter | Prior Art | | Present Invention | |
|---|---|---|---|---|
| Resolution | 12 bit | 14 bit | 8 bit | 11–12 bit |
| Settling time to 1/2 LSB | 250 ns | 400 ns | <10 ns | 25 ns |

The present invention provides a PNP transistor with satisfactory series-collector resistance and frequency response characteristics to enable integration of the voltage output amplifier stage into a current mode DAC to provide current to voltage conversion. This eliminates the need for off-chip current to voltage conversion stages of the prior art DACs.

Figure 19:
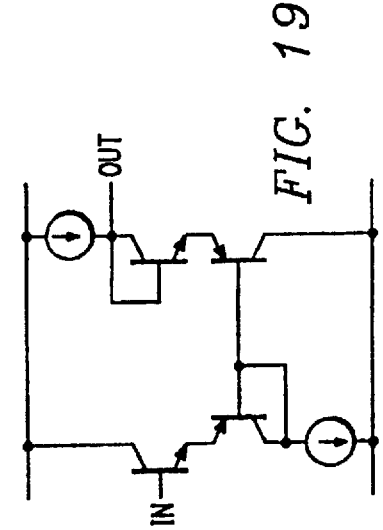
FIG. 19 illustrates a switch stage incorporating the invention.

A switch stage of the pin driver circuit is illustrated in FIG. 19B. It turns on or off the signal path between the input and output by turning on or off a controlled current source. When the switch stage is on, it becomes a low resistance path to DC and AC signals and thus yields small offset voltages and small AC attenuations. When the switch, output or control current sources is off, the output node becomes a high impedance point. Very often, a differential pair is used to turn on or turn off the current source. The output signal on the switch has a rise and a fall time of under one nanosecond.

Figure 20:
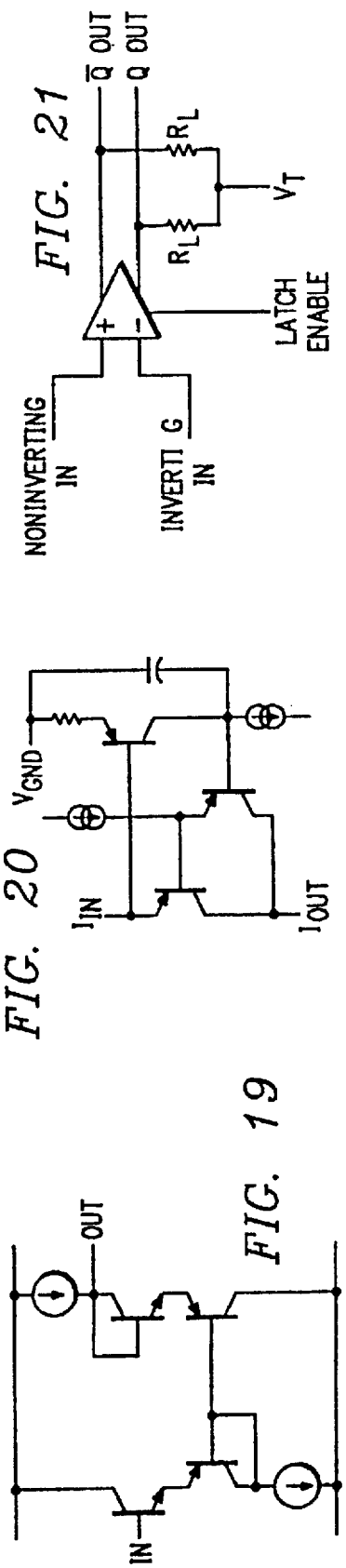
FIG. 20 is a schematic of a current conveyor incorporating the invention.

The current conveyor of FIG. 20 consists of at least one low impedance input which acts as a virtual ground and at least one high impedance output. The input current injected into the current conveyor through the low impedance input via a resistor and a voltage source, or by at least one current source, is amplified or added to the current of another input before it reaches the output. A current conveyor incorporating a transistor according to the present invention has a high frequency response providing propagation delays of less than 1 nanosecond. The Beta-Early voltage product enables more linear current programming and higher output impedances. It may also be made with complementary bipolar transistors which maintains the speed requirements while providing the capability of handling bidirectional signals.

Figure 21:
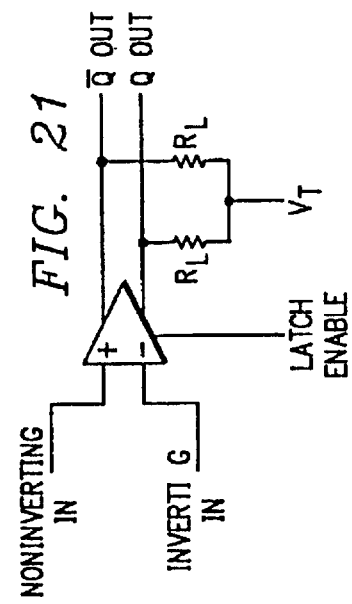
FIG. 21 is a schematic of a comparator incorporating the invention.

An ultra high speed comparator is illustrated in FIG. 21 having applications in linear and mixed signal test systems, fiber optics communication and high speed data acquisition systems. It can be developed with ECL compatible logic outputs as well as with TTL outputs. The comparator of FIG. 21 incorporating transistors of the present invention exhibits propagation delays of 0.5 ns (ECL) and 1.0 ns (TTL).

The above examples illustrate improvements in standard circuits which incorporate transistors of the present invention. With these transistor characteristics new circuits heretofore unavailable can also be developed.

Although the present invention has been described and illustrated in detail, it is to be understood that the same is by way of example only, and is not to be taken by way of limitation. The spirit and scope of the present invention are to be limited only by the claims which follow.

What is claimed:

1. An IC digital to analog converter with at least eleven bit resolution and a settling time to ½ LSB of less than 30 nanoseconds comprising:

a first PNP transistor formed in a first electrically isolated semiconductor island in a semiconductor surface;

said first transistor including a P-conductivity type collector having a heavily doped region adjoining a more lightly doped region of the same conductivity type;

said first transistor being vertically structured with respect to the semiconductor surface (i) with the heavily doped collector region below the surface, (ii) with the more lightly doped collector region positioned between the surface and the heavily doped collector region, (iii) with a base formed in a region adjoining the more lightly doped collector region, and (iv) with an emitter positioned above the heavily doped collector region and surrounded by the region in which the base is formed;

a first NPN transistor formed in a second electrically isolated semiconductor island in said semiconductor surface;

said second transistor including a N-conductivity type collector having a more heavily doped region of the same conductivity type and being vertically structured with respect to the semiconductor surface (i) with the heavily doped collector region below the surface, (ii) with the more lightly doped collector region positioned between the surface and the heavily doped collector region, (iii) with a base formed in a region adjoining the more lightly doped collector region, and (iv) with an emitter positioned above the heavily doped collector region and surrounded by the region in which the base is formed;

a first plurality of NPN transistors vertically structured like said first transistor each with an emitter positioned above a collector and in a region surrounded by the region in which a base is formed; and a second plurality of NPN transistors vertically structured like said second transistor each with an emitter positioned above a collector and in a region surrounded by the region in which a base is formed.

2. An IC feedback amplifier with a bandwidth of at least 500 MHz and a slew rate of at least 2,000 volts per second comprising:

a first PNP transistor formed in a first electrically isolated semiconductor island in a semiconductor surface;

said first transistor including a P-conductivity type collector having a heavily doped region adjoining a more lightly doped region of the same conductivity type;

said first transistor being vertically structured with respect to the semiconductor surface (i) with the heavily doped collector region below the surface, (ii) with the more lightly doped collector region positioned between the surface and the heavily doped collector region, (iii) with a base formed in a region adjoining the more lightly doped collector region, and (iv) with an emitter positioned above the heavily doped collector region and surrounded by the region in which the base is formed;

a first NPN transistor formed in a second electrically isolated semiconductor island in said semiconductor surface;

said second transistor including a N-conductivity type collector having a more heavily doped region of the same conductivity type and being vertically structured with respect to the semiconductor surface (i) with the heavily doped collector region below the surface, (ii) with the more lightly doped collector region positioned between the surface and the heavily doped collector region, (iii) with a base formed in a region adjoining the more lightly doped collector region, and (iv) with an emitter positioned above the heavily doped collector region and surrounded by the region in which the base is formed;

a first plurality of NPN transistors vertically structured like said first transistor each with an emitter positioned above a collector and in a region surrounded by the region in which a base is formed; and a second plurality of NPN transistors vertically structured like said second transistor each with an emitter positioned above a collector and in a region surrounded by the region in which a base is formed.

3. A sample and hold amplifier comprising:

a first transconductance amplifier having inverting and noninverting input terminals and an offset adjustment;

a low leakage voltage switch operably connected to receive the output signal from said first transconductance amplifier;

an integrating amplifier operably connected to receive any signal passed through said switch; and means including a sample and hold gate for controlling the operation of said switch;

said amplifiers being either both voltage or both current feedback amplifiers having an acquisition time less than 50 nanoseconds, a slew rate at least 150 volts per microsecond, a bandwidth of at least 45 MHz, and a resolution of at least 12 bits.

4. The sample and hold amplifier of claim 3 wherein both of said amplifiers are current feedback amplifiers and having an acquisition time less than 15 nanoseconds, a slew rate at least 500 volts per microsecond, and a bandwidth of at least 200 MHz.

5. A comparator comprising:

a first amplifier having inverting and noninverting input terminals, a latch enable control terminal and complementary signal output terminals; and means for operably connecting each of said output terminals to a voltage source, said amplifier being a feedback amplifier having an acquisition time less than 50 nanoseconds, a slew rate of at least 150 volts per microsecond, a bandwidth of at least 45 MHz, and a resolution of at least 12 bits, whereby said comparator exhibits propagation delays of not more than 0.5 nanoseconds (ECL) and 1.0 nanoseconds (TTL).

6. An integrated circuit along a semiconductor surface comprising a first PNP transistor formed in a first electrically isolated semiconductor island and a second NPN transistor formed in a second electrically isolated semiconductor island wherein:

the first transistor includes a P-conductivity type collector having a heavily doped region adjoining a more lightly doped region of the same conductivity type; and the second transistor includes a N-conductivity type collector having a more heavily doped region of the same conductivity type, wherein the first and second transistors are each vertically structured with respect to the semiconductor surface with the heavily doped collector region below the surface and the more lightly doped collector region positioned between the surface and the heavily doped collector region, each transistor further including:

a base formed in a region adjoining the more lightly doped collector region; and an emitter positioned above the heavily doped collector region and surrounded by the region in which the base is formed.

7. The circuit of claim 6 configured as a feedback amplifier characterized by a bandwidth of at least 500 MHz and a slew rate of at least 2,000 volts per microsecond.

8. The circuit of claim 2 operable with a supply current less than 25 milliamps.

9. The feedback amplifier circuit of claim 7 having a settling time less than 10 nanoseconds.

10. The circuit of claim 2 wherein said feedback is a current feedback amplifier having an output voltage of ±3 volts peak to peak into a 100 ohm load.

11. The circuit of claim 1 including at least one additional feedback amplifier operably; and wherein said feedback amplifiers are operably connected to provide a sample and hold circuit with an acquisition time less than 50 nanoseconds.

12. The sample and hold circuit of claim 11 wherein each of said feedback amplifiers has a slew rate of at lease 100 volts per microsecond and a bandwidth of at least 20 MHz.

13. The circuit of claim 1 wherein said PNP and NPN transistors are operably connected as a comparator having a propagation delay less than 1.5 nanoseconds.

14. The comparator of claim 13 having ECL compatible output voltage levels and a propagation delay less than one nanosecond.

* * * * *